United States Patent [19]
Goss et al.

[11] Patent Number: 5,251,099
[45] Date of Patent: Oct. 5, 1993

[54] HIGH DENSITY ELECTRONICS PACKAGE HAVING STACKED CIRCUIT BOARDS

[75] Inventors: Steven R. Goss; Owen H. Taggart, both of Tucson, Ariz.

[73] Assignee: Hughes Aircraft Company, Los Angeles, Calif.

[21] Appl. No.: 929,354

[22] Filed: Aug. 14, 1992

[51] Int. Cl.$^5$ ............................................. H05K 7/20
[52] U.S. Cl. .................................. 361/721; 165/80.3; 211/41; 257/713; 361/744; 361/790
[58] Field of Search .......... 211/41; 361/382, 386–389, 361/395–396, 412, 413, 415; 165/80.3, 185; 257/706, 712, 713, 718; 439/485; 174/16.3, 252

[56] References Cited

U.S. PATENT DOCUMENTS

| | | | |
|---|---|---|---|
| 4,514,784 | 4/1985 | Williams | 361/396 |
| 4,858,068 | 8/1989 | Bitler | 361/380 |
| 4,956,746 | 9/1990 | Gates, Jr. | 361/396 |
| 5,105,337 | 4/1992 | Bitler | 361/396 |

*Primary Examiner*—Gerald P. Tolin
*Attorney, Agent, or Firm*—Charles D. Brown; Randall M. Heald; Wanda K. Denson-Low

[57] ABSTRACT

A high-density electronics package (10) that houses a plurality of circuit cards (21,22,25,26), heat sinks (23,27) and circuit interconnections (33) in a single housing (12). The electronics package (10) uses conical shaped interfaces for locating and locking components, which greatly enhances the serviceability, thermal management and strength of the electronics package (10). Assembly is accomplished by using a selected conical angle on a first heat sink (23) that mates with a matching conical surface (13) on the housing (12). A second heat sink (27) has a conical angle (located in the opposite direction of the conical angle of the first heat sink) that mates with an identical angle on an expandable wedge ring (31) used for positioning purposes. This mounting feature provides automatic heat sink to heat sink axial alignment regardless of tolerances, therefore simplifying assembly and providing intimate contact between the heat sinks (23,27) and the housing (12), and thus creating a thermal path from the circuit cards (21,22,25,26) to the housing (12). A model of the electronics package (10) has been designed, built and tested, and provides a lightweight, thermally conductive, and structurally sound electronics package (10). The present package concept also provides for greater serviceability, easier fabrication, faster assembly, lower cost and increased design latitude. The electronics package (10) is easily fabricated and requires no special tooling. Assembly of components into the housing (12) is accomplished within minutes and disassembly is equally fast and easy.

11 Claims, 6 Drawing Sheets

HIGH DENSITY ELECTRONICS PACKAGE HAVING STACKED CIRCUIT BOARDS

BACKGROUND

The present invention relates to electronic components having multiple circuit board, and more particularly, to a high density electronics package having a plurality of stacked circuit boards that are heat-sinked to the housing.

A common method of mounting cylindrical circuit boards in electronic housings is by using screws and standoffs. This method of mounting circuit boards requires areas on the circuit boards to be kept clear of components and circuitry, thus reducing the usable area of the boards. Multiple stacks of circuit boards using standoffs require close tolerance of screw holes, spacers, and circuit card/heat sink thicknesses. If this is not the case, the ending tolerance stack-up prevents a proper fit and alignment within the housing. Current cylindrical housings and circuit boards are generally mounted together using conventional screw fasteners and standoffs. This method makes the electronics package difficult to assemble, provides poor vibration resistance and makes thermal management difficult.

When a thermal path to an electronic housing is needed, it often requires the design and installation of elaborate devices to accomplish this. The drawbacks of such thermal path hardware are a minimal thermal path and relatively weak structural integrity. To obtain structural stiffness, a large quantity of screws and standoffs or stiffeners are required, since support is generally furnished only in small areas where the diameter of the standoffs contact the circuit boards. The use of lightweight "touch" type connectors (woe strips, fuzz buttons, etc.) are difficult to employ in this type of design due to the inherent lack of positioning capability. Distortion of circuit boards by use of screw fasteners may cause gaps between the contacts, thus creating board malfunctions.

Therefore, it is an objective of the present invention to provide for a high density electronics unit having a plurality of stacked circuit boards that is structurally strong and has sufficient heat sinking.

SUMMARY OF THE INVENTION

In order to meet the above objectives, the present invention is a high-density electronics package that houses a plurality of circular circuit boards, or cards, along with heat sinks and circuit interconnections in a single enclosure. The electronics package comprises a housing having a conical shape disposed around at least a major portion of the periphery of an internal wall thereof. A first heat sink is disposed in the housing that has a conical shaped periphery that slidably mates with the housing conical shape along their respective surfaces. First and second circuit boards, or cards, are disposed on opposed surfaces of the first heat sink and are interconnected by means of a first set of mating connectors disposed through the first heat sink. A second heat sink is disposed in the housing that has a conical shaped periphery that is oriented in a direction opposite to the conical shape of the first heat sink.

Third and fourth circuit boards, or cards, are disposed on opposed surfaces of the second heat sink and are interconnected by means of a second set of mating connectors disposed through the second heat sink. A third set of mating connectors interconnect the second and third circuit boards. An expandable conical shaped ring is provided that translates the conical shaped periphery of the second heat sink to the vertical inner wall of the housing. A fourth set of mating connectors interconnect the fourth circuit board and the electrical interface board. A second expandable conical shaped ring is provided to secure all boards and heat sinks within the housing. A small wedge shaped block is used to spread the second conical shaped ring and induce a compression load on all internal assemblies.

The high-density electronics package may be used in aerospace applications where electronic circuit cards must be packaged as a lightweight, highly thermally conductive, and structurally sound unit. The present invention is a unique packaging arrangement for circular circuit cards, for example, that maximizes thermal transfer from the circuit cards to the housing. The present invention also provides extreme rigidity, allowing the assembly to pass rigid military mission requirements. This is achieved by bonding the circuit cards to the heat sinks that are positioned by the use of conical angles on the heat sinks and by the use of the conical expansion ring that provides both locational and locking mechanisms.

The electronics package provides an assembly for electronic circuit boards that achieves suitable thermal management without the use of miscellaneous additional hardware. The electronics package provides for superior thermal transfer capabilities, reduced circuit board flexing (especially advantageous with HDMI technology), and less weight than previous packages, including card locks. Assembly is accomplished by using a selected conical angle on the first heat sink that mates with a matching conical angle on the housing. The second heat sink also has a conical angle (that is located in the opposite direction of the first heat sink) that mates with an identical angle on an expansion ring used for positioning purposes. This mounting feature provides automatic heat sink to heat sink axial alignment regardless of tolerances, therefore simplifying assembly and providing intimate contact between the heat sinks and the housing, and thus creating a thermal path from the circuit boards to the housing.

An embodiment of a electronics package of the present invention has been designed, built and tested, and satisfies the need for a lightweight, thermally conductive, and structurally sound electronics package. The present invention provides for greater serviceability, easier fabrication, faster assembly, lower cost and increased design latitude. The present electronics package may be used in the aerospace industry, although any application requiring the use of a plurality of stacked circuit boards operating in a hostile environment would benefit from using the present invention. The high-density electronics package also provides for standardization and modularity in space vehicle and missile designs, for example.

The high-density electronics package provides for a superior design for applications requiring an easily assembled electronics package. The use of wedge-shaped devices for locating and locking, instead of threaded fasteners, greatly enhances the serviceability, thermal management and strength of electronics packages in which they are employed. The electronics package is easily fabricated and requires no special tooling. Assembly of components into the housing is accomplished within minutes and disassembly is equally fast and easy.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
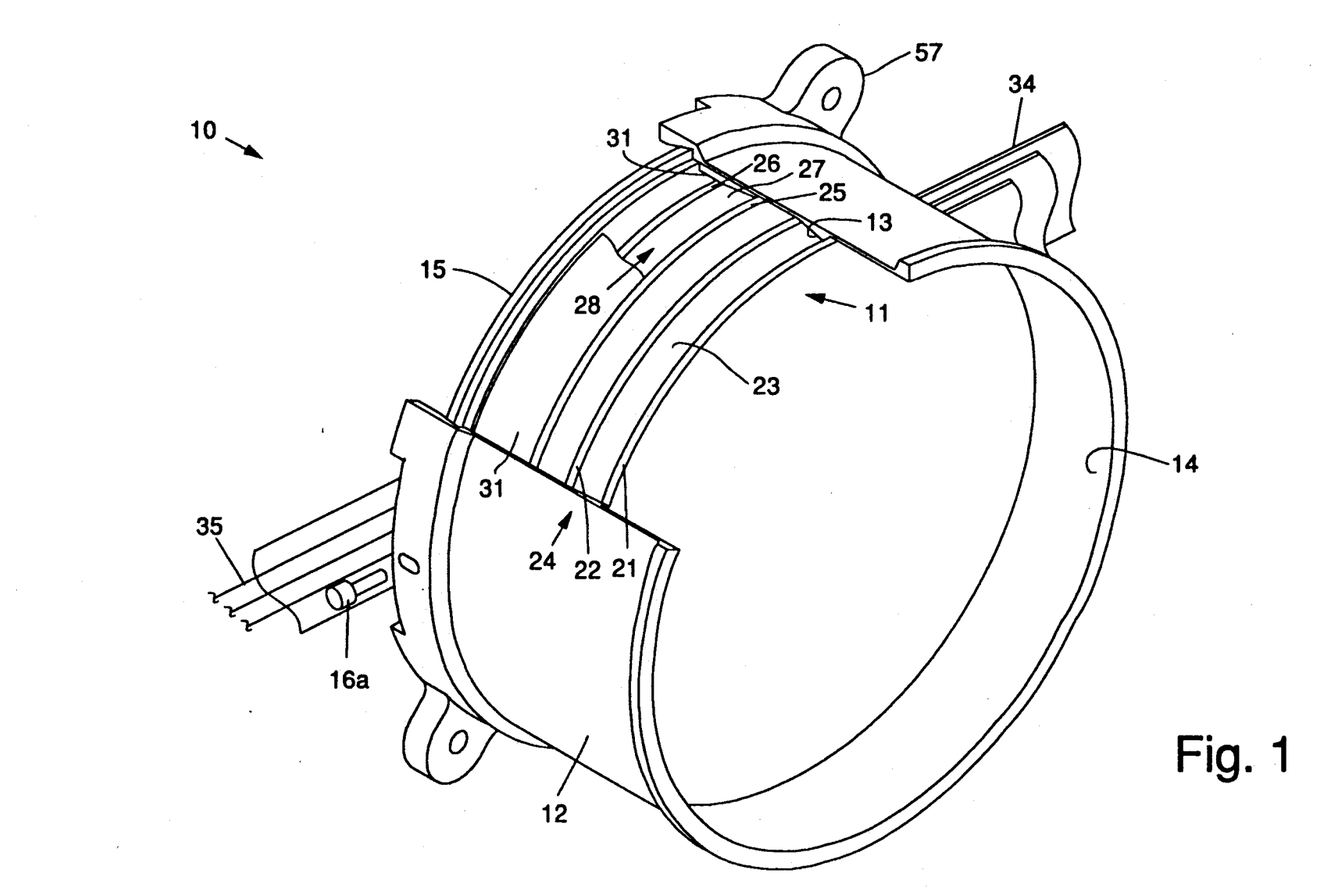
FIG. 1 is an assembled, partially broken away, electronics package in accordance with the principles of the present invention, showing details of a circuit card stack.
Figure 2:
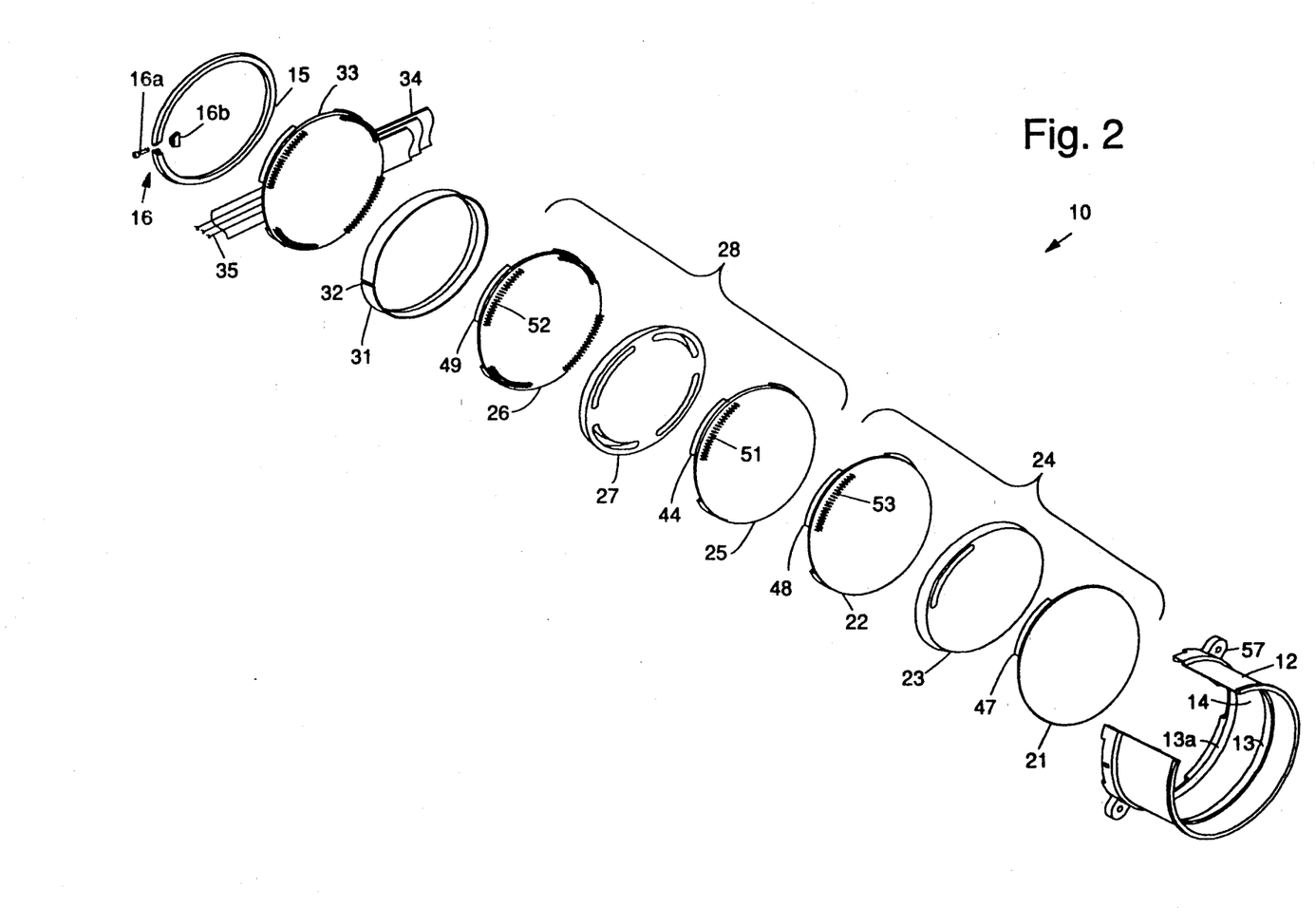
FIG. 2 shows an exploded view of an assembled electronics package.

Referring to the drawing figures, FIG. 1 shows an assembled electronics package 10 in accordance with the principles of the present invention, while FIG. 2 shows an exploded view of the electronics package 10. The electronics package 10 is shown partially broken away, thus illustrating internal details of a circuit card stack 11 housed therein. The electronics package 10 is comprised of a housing 12 into which a plurality of stacked circuit cards 21, 22, 25, 26 comprising the circuit card stack 11 are disposed, and which are retained in the housing 12 by means of a conical surface 13 that forms part of an internal wall 14 of the housing 12, and a lock ring 15 and wedge-lock mechanism 16.

First and second circular circuit cards 21, 22 are bonded to a first heat sink 23 to form a first subassembly 24. A conical angle is formed on the edge of the first subassembly 24 that is adapted to mate with the conical surface 13 of the housing 12. Third and fourth circuit cards 25, 26 are bonded to a second heat sink 27 and form a second subassembly 28. An expandable conical wedge ring 31 is provided that has an internal angle that is adapted to wedge itself between the outer edge of the second subassembly 28 and the internal wall 14 of the housing 12. An electrical interface board 33 is provided that is electrically connected to each of the circuit cards 21, 22, 25, 26. External connections are made by way of flat electrical cables 34 or wires 35 as may be chosen by the designer. A tapered lock ring 15 and wedge-lock mechanism 16 (comprising a screw 16a and a lock 16b) are provided to secure the components in the housing 12.

Assembling the electronics package 10 depicted in FIG. 1 is as follows. The first circuit card 21 and the second circuit card 22 are interconnected and bonded to the first heat sink 23 and form the first subassembly 24. The third circuit card 25 and fourth circuit card 26 are interconnected and bonded to the second heat sink 27 and form the second subassembly 28. The first and second subassemblies 24, 28 are connected using pin and socket or compression type contacts to form the circuit card stack 11 which is placed into the housing 12. The conical angle on the edge of the first subassembly 24 engages the mating conical surface 13 on the inner wall of the housing 12. The wedge ring 31 which has a radially located slot 32 (see FIG. 4) to allow for contraction and expansion, and a conical internal angle 38, is then slipped into the housing 12, wedging itself between the edge of the second subassembly 28 and the internal wall 14 of the housing 12.

The electrical interface board 33 contacts the top surface of the wedge ring 31 and makes electrical interconnection with the assembled circuit cards 21, 22, 25, 26, using pin and socket type contacts. The pin and socket arrangement representative of each of the cards 21, 22, 25, 26 is shown more clearly in FIG. 7. The lock ring 15 is positioned above the electrical interface board 33 and has a wedge shaped slot 17 that provides for expansion and contraction to facilitate installation and compression locking. The lock 16b, which is activated with one screw 16a, engages the lock ring 15, expanding the ring 15 and forcing it against the negative conical surface 13a formed on the inner wall 14 of the housing 12. This action causes downward pressure that forces the circuit card stack to seat and center itself into the housing 12 by engaging the first heat sink 23 and conical surface 13, thus providing maximum mechanical retention and thermal transfer. When transverse movement of the first heat sink 23 ceases, continual expansion of the lock ring 15, forces a compression contact between conical surface of the second heat sink 27 and the inner wall of the housing 12 through the lock ring 15, similar to an expanding collet. At a predetermined point, when a specified torque is met on the lock screw 16a, the wedge ring 31, by expanding, eliminates the tolerance stack up, axially locates the circuit card stack 11, provides a positive thermal path to the housing 12, and provides the desired structural integrity for the electronics package 10.

Figure 3:
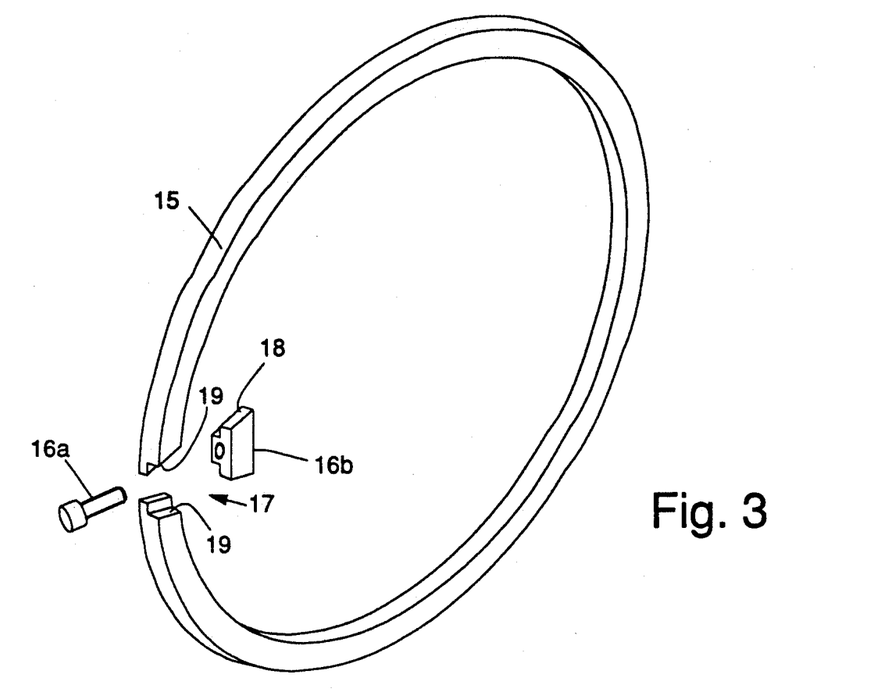
FIG. 3 shows a conical lock ring and wedge-lock mechanism employed in the electronics package of FIG. 1.

For the purposes of clarity and completeness, illustrations of the component comprising the electronics package 10 will be described in greater detail. FIG. 3 is a view of the lock ring 15 and wedge-lock mechanism 16 employed in the electronics package 10 of FIG. 1. As can be seen, the wedge shaped slot 17 provides for expansion and contraction of the lock ring 15 to facilitate installation and compression locking. The lock 16b is engaged with a screw 16a that expands the ring 15 by pulling the lock with its outwardly tapered edges 18 to expand the ring 15 by exerting pressure on similarly tapered inward edges 19 of the slot 17.

Figure 4:
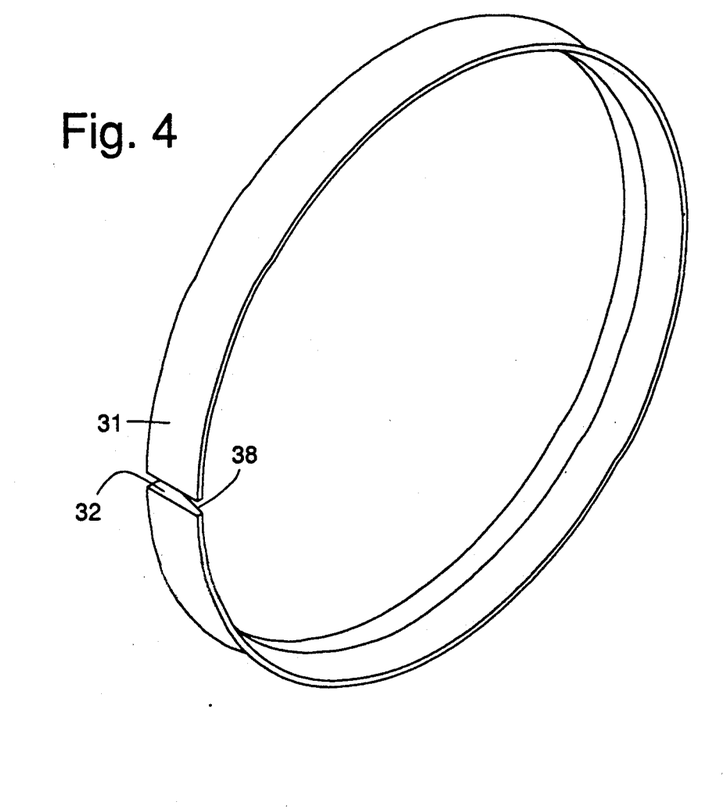
FIG. 4 shows a conical expandable ring employed in the electronics package of FIG. 1.

FIG. 4 shows the wedge ring 31 employed in the electronics package 10 of FIG. 1. The slot 32 in the wedge ring 31 that permits expansion is more clearly shown. The internally tapered edge 38 of the wedge ring 31 is also shown.

Figure 5:
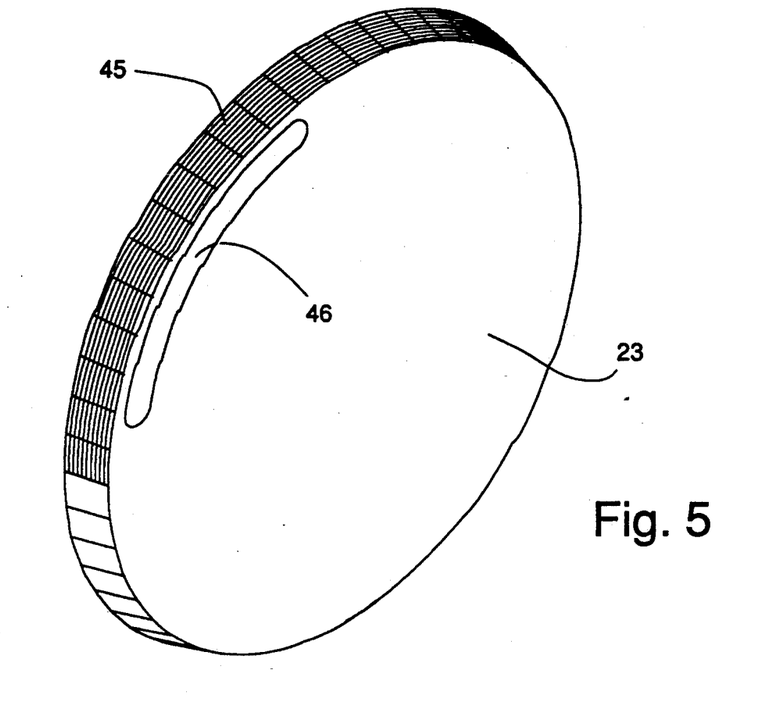
FIG. 5 shows a first heat sink employed in the electronics package of FIG. 1.

FIG. 5 shows the first heat sink 23 employed in the electronics package 10 of FIG. 1. The first heat sink 23 is shown having a conical outer edge 45 that matches the taper of the conical surface 13 formed on the inner wall 14 of the housing 12. One slot 46 is shown that permit passage of a connector 47 that interconnect the first and second circuit cards 21, 22.

Figure 6:
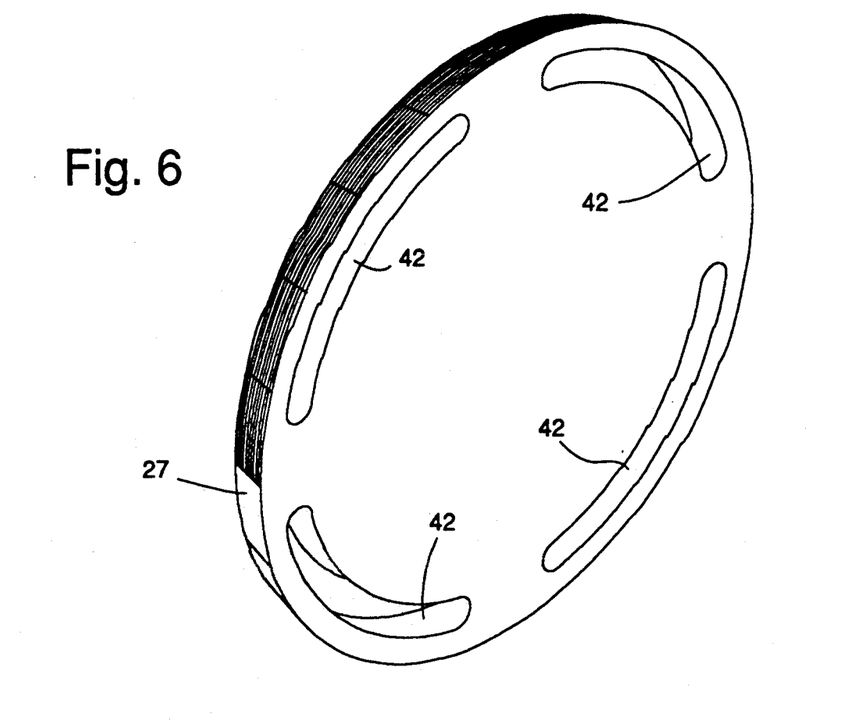
FIG. 6 shows a second heat sink employed in the electronics package of FIG. 1.

FIG. 6 shows the second heat sink 27 employed in the electronics package 10 of FIG. 1. The second heat sink 27 is shown having a conical outer edge 41 that engages the conical edge 38 of the wedge ring 31. Four slots 42 are shown that permit passage of connectors 44 on the third circuit card 25 that interconnect the third and fourth circuit cards 25, 26 together.

Figure 7:
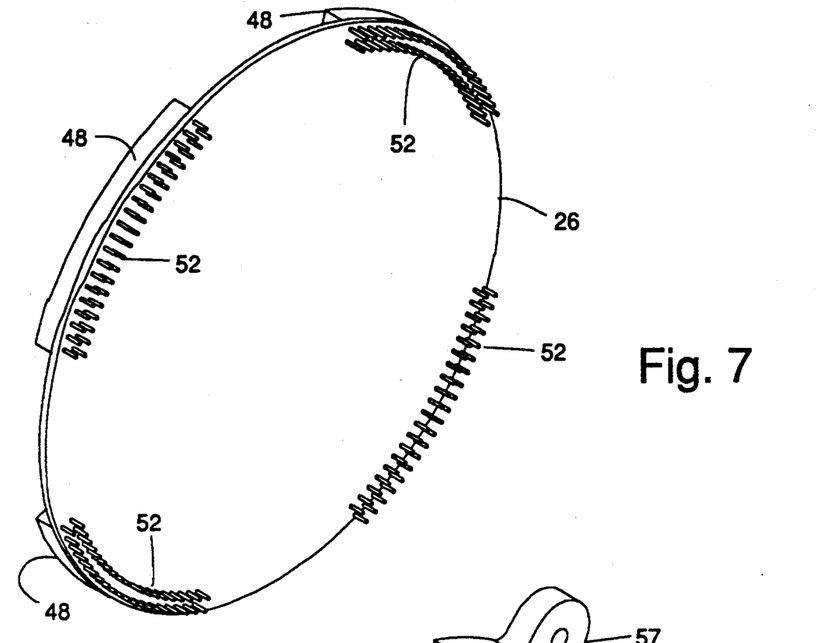
FIG. 7 shows a typical stacked circuit card arrangement using a stacked connector configuration employed in the electronics package of FIG. 1.

FIG. 7 shows a typical circuit card that is representative of the circuit cards 21, 22, 25, 26 employed in the electronics package 10 of FIG. 1. The sets of connector pins 52 of the fourth circuit card 26 engage the connectors 44 of the third circuit card 25. Also, a connector 49 of the fourth circuit card 26 connect with connectors 50 of the interface circuit board 33 (see FIG. 2). In a similar manner, a set of connector pins 51 of the third circuit card 25 engage a connector 48 of the second circuit card 22 (see FIG. 2). Similarly, a set of connector pins 53 of the second circuit card 22 engage a connector 47 of the first circuit card 21 (see FIG. 2).

Figure 8:
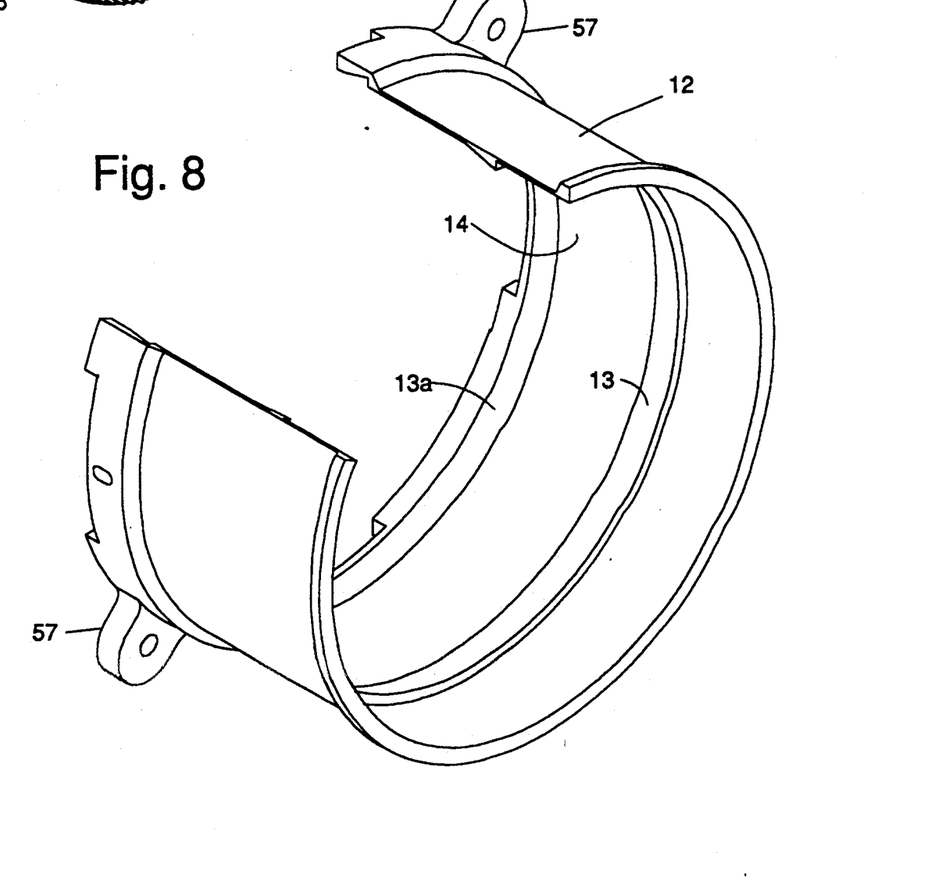
FIG. 8 shows a housing of the electronics package of FIG. 1, partially broken away, showing detail of the internal features employed therein.

FIG. 8 shows the housing 12 of the electronics package 10 of FIG. 1, partially broken away, showing detail of the internal components thereof. The conical surfaces 13, 13a disposed on the inner wall 14 is shown more clearly. Mounting feet 57 are shown as a means that permit mounting of the electronics package 10 to a bulkhead, for example.

Figure 9:
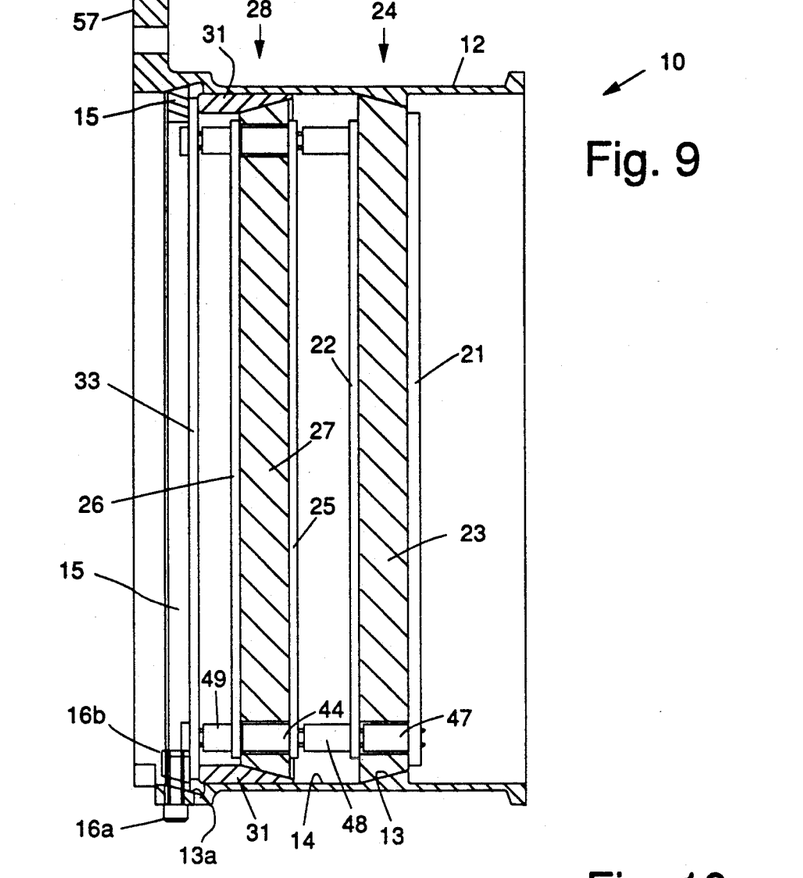
FIG. 9 is a cross-sectional view of an assembled electronics package.

FIG. 9 is a cross-sectional view of an assembled electronics package 10. The interconnection of the various connectors and pins of each of the circuit cards 21, 22, 25, 26, and the interconnection of the fourth circuit card 26 to the electrical interface board 33 is clearly shown. The mating of the conical angle on the edge of the first heat sink 23 with the mating conical surface 13 on the inner wall of the housing 12 is more clearly shown. Similarly, the wedge ring 31 is shown wedged between the edge of the second heat sink 27 and the internal wall 14 of the housing 12.

Figure 10:
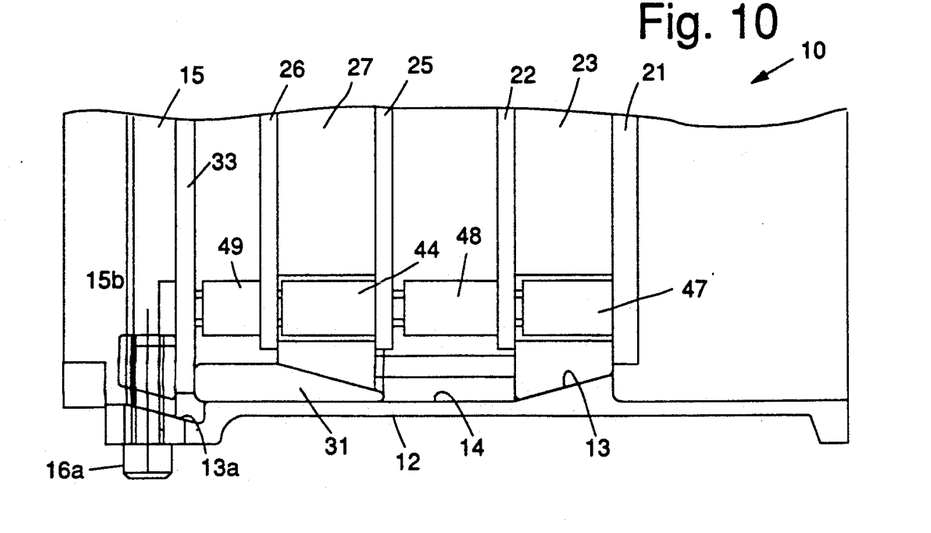
FIG. 10 is an enlarged sectional view of the assembled electronics package of FIG. 9, emphasizing the mechanisms that provide the unique locking and thermal transfer aspects of the present invention.

FIG. 10 is an enlarged sectional view of the assembled electronics package 10 of FIG. 9, emphasizing the mechanisms that provide the unique locking and thermal transfer aspects of the present invention. It more clearly defines how the lock ring 15 compresses the circuit card stack 11 when expanded into conical surface 13a of the housing 12 by tightening the lock screw 16a.

The high-density electronics package 10 may be used in aerospace applications where electronic circuit cards must be packaged as a lightweight, highly thermally conductive, and structurally sound package. More specifically, the present invention is a unique packaging arrangement for circular circuit cards, for example, that maximizes thermal transfer from the circuit cards 21, 22, 25, 26 to the housing 12. The present invention also provides extreme rigidity allowing the package 10 to pass rigid military mission requirements. This is achieved by bonding the circuit cards 21, 22, 25, 26 to the heat sinks 23, 27 then positioning the subassemblies by the use of conical angles on the edges of the heat sinks 23, 27 and the expandable conical wedge ring 31 compressed between the conical surfaces 13, 13a that both locates and locks the components in the housing 12.

The high-density electronics package 10 provides an assembly for circular electronic circuit boards that achieves suitable thermal management without the use of miscellaneous additional hardware. The electronics package 10 provides superior thermal transfer capabilities, reduced circuit board flexing, which is especially advantageous with HDMI technology, and less weight than previous packages, including card locks. The packaging and thermal management features provide heat sink 23 to heat sink 27 axial alignment regardless of tolerances, therefore simplifying assembly, and provides intimate contact between the heat sinks 23, 27 and the housing 12, and thus creating a thermal path from the circuit cards 21, 22, 25, 26 to the housing 12.

An embodiment of a cylindrical high-density electronics package 10 has been designed, built and tested, and satisfies a need for a lightweight, thermally conductive, and structurally sound electronics package. The present invention provides a structure that achieves these requirements, and also provides for greater serviceability, easier fabrication, faster assembly, lower cost and increased design latitude. Primary applications for the electronics package 10 are in the aerospace industry, although any application requiring the use of a plurality of stacked circuit boards operating in a hostile environment would benefit from using the novel aspects of the present electronics package 10. The high-density electronics package 10 also provides for standardization and modularity in space vehicle and missile designs, for example.

The high-density electronics package 10 provides for a superior design for applications requiring an easily assembled electronics package. The use of wedge-shaped devices for locating and locking, instead of threaded fasteners, greatly enhances the serviceability, thermal management and strength of electronics packages in which they are employed. The electronics package 10 is easily fabricated and required no special tooling. Assembly of components into the housing 12 is accomplished within minutes and disassembly is equally fast and easy.

Thus there has been described a new and improved high density electronics package having a plurality of stacked circuit boards that are heat sinked to the housing. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An electronics package comprising:
    a housing having a first conical shaped surface disposed around the periphery of an internal wall thereof;
    a first heat sink disposed within the housing that has a conical shaped surface that slidably engages the first conical shaped surface along their respective conical shaped surfaces;
    first and second circuit boards disposed on opposite surfaces of the first heat sink that are interconnected by first connection means disposed through the first heat sink;
    a second heat sink disposed within the housing that has a conical shaped surface that is oriented in a direction opposite to the conical shaped surface of the first heat sink;
    third and fourth circuit boards disposed on opposite surfaces of the second heat sink that are interconnected by means of a second connection means disposed through the second heat sink, and wherein the third circuit board is also interconnected to the second circuit board by the first connection means;

an expandable conical shaped member that contacts the conical shaped surface of the second heat sink along at least a portion thereof;

an electrical interconnection circuit board electrically connected to the fourth circuit board that comprises means for coupling electrical signals to the respective circuit boards from outside the electronics package; and a locking mechanism that engages the housing and the electrical interconnection circuit board, and forces the electrical interconnection circuit board and expandable conical shaped member toward the first conical surface of the housing, thus forcing the circuit boards and heat sinks against the first conical surface on the inner wall of the housing, and thus securing the heat sinks, circuit boards, and electrical interconnection circuit board in the housing.

2. The electronics package of claim 1 wherein the conical shaped surface forms a part of the internal wall of the housing.

3. The electronics package of claim 1 wherein the first and second heat sinks the first, second, third, and fourth circuit boards, and the electrical interconnection circuit board are circular.

4. The electronics package of claim 1 wherein the locking mechanism comprises an expandable lock ring, a lock, and means for securing the lock to the lock ring and housing.

5. An electronics package comprising:
a housing having an inner wall, a portion of which is a conical surface disposed around the periphery of the internal wall of the housing;

a first heat sink disposed within the housing that has a conical shaped surface that slidably engages the conical surface of the housing along their respective conical shaped surfaces;

first and second circuit boards disposed on opposite surfaces of the first heat sink that are interconnected by means of a first set of mating connectors disposed through the first heat sink, and wherein the second circuit board has a second set of connectors;

a second heat sink disposed within the housing that has a conical shaped surface that is oriented in a direction opposite to the conical shaped surface of the first heat sink;

third and fourth circuit boards disposed on opposite surfaces of the second heat sink that are interconnected by means of a third set of mating connectors disposed through the second heat sink and wherein the fourth circuit board has a fourth set of connectors;

and wherein the second set of mating connectors of the second circuit board interconnect to the third set of mating connectors of the third circuit board;

an expandable conical shaped member slidably engaging the conical shaped surface of the second heat sink and the inner wall of the housing;

an electrical interconnection circuit board electrically connected to the fourth circuit board by means of the fourth set of connectors that comprises means for coupling electrical signals to and from the respective circuit boards and circuitry disposed outside the electronics package; and a locking mechanism including a lock ring engaging the housing and the electrical interconnection circuit board, and forcing the electrical interconnection circuit board and expandable conical shaped member toward the conical shaped surface of the housing, thus forcing the heat sinks and circuit cards together to secure them between the conical shaped surface of the housing and the locking mechanism.

6. The electronics package of claim 5 wherein the conical shaped features form a part of the internal wall of the housing.

7. The electronics package of claim 5 wherein the first and second heat sinks the first, second, third, and fourth circuit boards, and the electrical interconnection circuit board are circular.

8. The electronics package of claim 5 wherein the locking mechanism comprises an expandable lock ring, a lock, and means for securing the lock to the lock ring and housing.

9. An electronics package comprising:
a housing having an internal wall, a portion of which is a conical surface that forms part of the internal wall of the housing;

a first heat sink having a conical shaped surface that slidably engages the conical feature of the housing along their respective wedge shaped surfaces;

first and second circuit boards disposed on opposite surfaces of the first heat sink, and wherein the first circuit board has a connector that mates with connector pins on the second circuit board, and wherein the connector and connector pins are interconnected through an opening through the first heat sink;

a second heat sink that has a conical shaped surface that is oriented in a direction opposite to the conical shaped surface of the first heat sink;

third and fourth circuit boards disposed on opposite surfaces of the second heat sink, and wherein the third circuit board has a connector that mates with connector pins on the fourth circuit board and wherein the connector and the connector pins are interconnected through an opening through the second heat sink, and wherein the third circuit board is connected to the second circuit board by a connectors on the second circuit board;

an expandable circular shaped ring that has a conical shaped surface that is oriented in a direction opposite to the conical shaped surface of the second heat sink and that contacts the conical shaped surface of the second heat sink;

an electrical interconnection circuit board electrically connected to electrical connectors of the fourth circuit board that is adapted to couple electrical signals to the respective circuit boards from outside the electronics package; and a locking mechanism including a locking ring that engages the housing and contacts the electrical interconnection circuit board and forces the electrical interconnection circuit board towards the expandable conical shaped ring when it is locked, and whereby the conical shaped surface of the conical shaped ring engages the conical shaped surface of the second heat sink, thus forcing the second and first heat sinks towards the conical surface of the housing, and securing the circuit boards, heat sinks and electrical interconnection circuit board in the housing.

10. The electronics package of claim 9 wherein the first and second heat sinks the first, second, third, and fourth circuit boards, and the electrical interconnection circuit board are circular.

11. The electronics package of claim 9 wherein the locking mechanism comprises an expandable lock ring, a lock, and means for securing the lock to the lock ring and housing.

* * * * *